United States Patent [19]
Kayanuma

[11] Patent Number: 4,984,053
[45] Date of Patent: Jan. 8, 1991

[54] BIPOLAR TRANSISTOR WITH REDUCED PARASITIC CAPACITANCE

[75] Inventor: Akio Kayanuma, Kanagawa, Japan

[73] Assignee: Sony Corporation, Tokyo, Japan

[21] Appl. No.: 175,263

[22] Filed: Mar. 30, 1988

[30] Foreign Application Priority Data

Apr. 10, 1987 [JP] Japan .................. 62-88353

[51] Int. Cl.$^5$ .................. H01L 27/082; H01L 23/535
[52] U.S. Cl. .................. 357/50; 357/20; 357/34; 357/52; 357/59
[58] Field of Search .................. 357/50, 59, 52, 20, 357/13, 34

[56] References Cited

U.S. PATENT DOCUMENTS

| | | | |
|---|---|---|---|
| Re. 27,045 | 2/1971 | Yu .................. | 357/34 |
| 4,003,072 | 1/1977 | Matsushita et al. .................. | 357/13 |
| 4,153,904 | 5/1979 | Tasich, Jr. et al. .................. | 357/13 |
| 4,292,642 | 9/1981 | Appels et al. .................. | 357/13 |
| 4,562,451 | 12/1985 | Fuse .................. | 357/52 |
| 4,642,674 | 2/1987 | Schoofs .................. | 357/13 |
| 4,729,965 | 3/1988 | Tamaki et al. .................. | 357/50 |
| 4,731,341 | 3/1988 | Kawakatsu .................. | 357/50 |
| 4,803,541 | 2/1989 | Kouda .................. | 357/13 |
| 4,868,624 | 9/1989 | Grung et al. .................. | 357/20 |

FOREIGN PATENT DOCUMENTS 2309980 11/1976 France .

Primary Examiner—William D. Larkins
Attorney, Agent, or Firm—Hill, Van Santen, Steadman & Simpson

[57] ABSTRACT

A bipolar integrated circuit having a polysilicon contact (26) to a heavily doped graft base region 24g which is spaced from oxide isolation walls 22 by a distance sufficiently small that in operation, the surface portion 37 of the collector region 23 is fully depleted from the graft base region 24g to the oxide isolation 22, so that base-collector capacitance is reduced due to the graft base being smaller than the oxide isolated island and by the absence of capacitance between the sides of the graft base region and the collector, while capacitance between the polysilicon contact 26 and the collector is also decreased by the depleted surface portion 37 of the collector.

4 Claims, 3 Drawing Sheets

BIPOLAR TRANSISTOR WITH REDUCED PARASITIC CAPACITANCE

BACKGROUND OF THE INVENTION

This invention relates to a bipolar transistor and more particularly to such bipolar transistor having a so-called graft base region for base contact.

As a bipolar transistor with high operating speed and low power consumption, there in known one such as shown for example in FIG. 5. In this figure, an n-type semiconductor layer is formed on, for example, a p-type semiconductor substrate 1 by, for example, epitaxial growth, and isolated by isolation regions 2, such as silicon oxide, into several island-shaped regions, such as region 3. A p-type base region 4 is formed to confront to the surface of the n-type semiconductor layer of this island-shaped region 3 and an n+ type emitter region 5 is formed within this base region 4. This base region 4 is formed by a base active region 4i at substantially the central portion for achieving the function of the base per se and a so-called graft base region 4g of higher concentration for the base electrode contact. The graft base region 4g is formed by diffusion of the p-type impurities from a base contact electrode 6 of the p+ type polycrystal silicon layer, while the base active region 4i is formed by ion implantation of p-type impurities using the base contact electrode 6 as a mask. The emitter region 5 is formed by introduction of n-type impurities from the n+ type polycrystal silicon layer 7 which serves as an emitter contact. The n+ type polycrystal silicon layer 7 is formed on the base contact electrode and also covering a side wall portion of the layer 7. The inner edge of the insulating layer 8 is used for the emitter diffusion mask.

A base electrode 9B formed of such as Al is connected to the base contact electrode 6, while an emitter electrode 9E is connected to the n+ type polycrystal silicon layer 7. It is noted that, in this example of FIG. 5, a collector electrode 9c is electrically connected to the island-shaped region 3 of the n-type epitaxial layer used as the collector region through the n+ type buried layer 11 and the n+ type electrode contact area 12.

With the above described so-called graft base type bipolar transistor, it is possible to simplify the process through emitter-base self-align and reduce parasitic capacity, while simultaneously minutizing the emitter width or achieving so-called shallow junction.

FIG. 6 shows to an enlarged scale the vicinity of the so-called graft base region 4g of the transistor. It may be seen from this figure that there exist a large quantity of the parasitic capacity $C_o$ through a depletion region $D_p$ in the vicinity of the bottom surface of the junction impeding high-speed operation. Also, when forming the isolation region 2 by, for example, selective oxidation of the silicon surface, fluctuations are caused in the element size due to so-called bird's beak generated in the vicinity of the semiconductor surface on the boundary of the area 2 and, above all, such fluctuations in the size are relatively increased when the area occupied by the element is to be decreased to achieve a higher degree of integration, thus impeding the higher degree of integration.

With this in view, a bipolar transistor having the structure shown in FIG. 7 is proposed. Thus a thin insulating layer 14 is formed on the semiconductor surface, and windows are formed in this insulating layer 14 at a prescribed distance from the boundary of the isolation region 2, after which the base contact electrode 6 formed of the aforementioned P+ type polycrystal silicon is deposited. This predetermined distance is so set as to be able to avoid the effect of the so-called bird's beak on the boundary of the aforementioned isolation region 2. Since the structure is otherwise the same as that in the above described example of FIG. 5 so that the corresponding parts are indicated by the same reference numerals and the corresponding description is omitted.

It is possible with the bipolar transistor of FIG. 7 to reduce the base area with higher precision and to reduce the parasitic capacity.

However, a depletion region $D_p$ exists which encircles the graft base region 4g, as shown in FIG. 8. Therefore, when considering the collector-base capacity there are produced a capacity $C_o'$ on the side of the junction bottom surface, a capacity $C_s$ on the side of the junction lateral surface and a capacity $C_{ox}$ formed by the base contact electrode 6 and the collector region (n-type epitaxial layer) 3 through an insulating layer 14, so that the parasitic capacity may become larger than that of the structure of FIG. 5 depending on the size.

OBJECT OF THE INVENTION

It is an object of the present invention to provide an improved bipolar transistor capable of high speed operation.

It is another object of the present invention to provide a bipolar transistor having reduced parastic capasitance between collector and base regions.

BRIEF DESCRIPTION OF THE DRAWINGS

FIGS. 5 to 8 refer to the prior art, wherein FIG. 5 is a schematic sectional view showing the prior art; FIG. 6 is a schematic sectional view showing essential parts of a prior-art example, to an enlarged scale; FIG. 7 is a schematic sectional view showing another prior-art example; and FIG. 8 is a schematic sectional view showing essential parts of the prior-art example of FIG. 7 to an enlarged scale.

DESCRIPTION OF THE PREFERRED EMBODIMENTS

In the present invention a bipolar transistor is provided in which a base contact region of a higher concentration is disposed between an emitter region and an isolation region and a base electrode is arranged on said base contact region. In operation, a depletion region is provided in the vicinity of the substrate surface between the base contact region and the isolation region.

The vicinity of the substrate surface between the base contact region and the isolation region is in the state of depletion, so that the parasitic capacity between the collector and the base is markedly reduced to realize the high speed operation.

Figure 1:
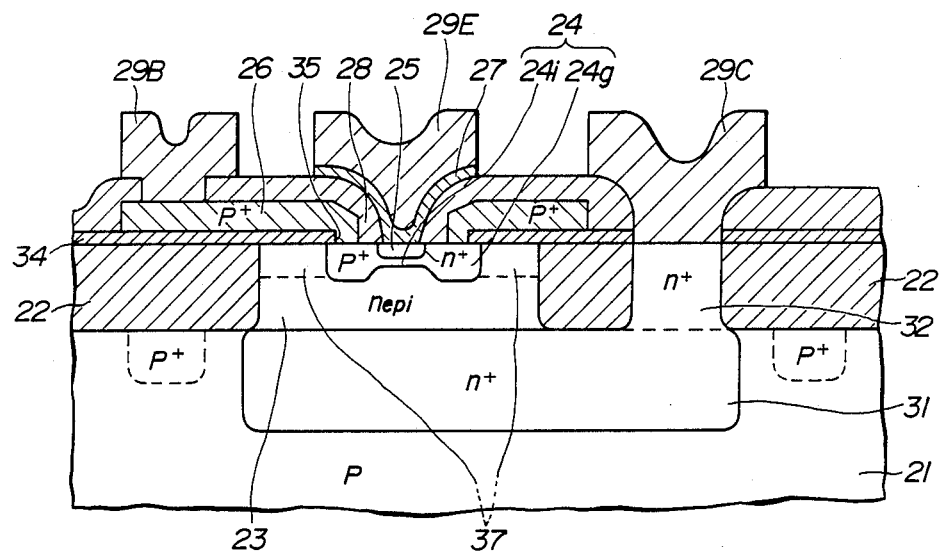
FIG. 1 is a schematic sectional view showing an embodiment of the present invention.

FIG. 1 is a schematic sectional view showing essential parts of the semiconductor device according to an embodiment of the present invention.

Referring to FIG. 1, an n-type semiconductor layer is formed as by epitaxial growth on, for example, a-type semiconductor substrate 21, which layer is isolated into several island-shaped regions, such as region 23, by isolation regions 22, such as of silicon oxide. A p-type base region 24 is formed for facing to the surface of the n-type semiconductor layer of the island-shaped region 23 and an n+ type emitter region 25 is formed within this base region 24. This base region 24 is formed by a base active region 24i at substantially the center for achieving the function of the base per se and a so-called graft base region 24g of a higher concentration for the base electrode contact. The graft base region 24g is formed by diffusion of p-type impurities from the base contact electrode 26 of the p+ type polycrystal silicon layer, while the base active region 24i is formed by ion implantation of p-type impurities with the base contact electrode 26 being used as a mask. The emitter region 25 is formed by introduction of n-type impurities from the n+ type polycrystal silicon layer 27 formed for the emitter contact on the insulating layer 28.

In addition, there are formed a base electrode 29B of, for example, A1, on the base contact electrode 26, and an emitter electrode 29E on the n+ type polycrystal silicon layer 27. It will be noted that, in the example of FIG. 1 the collector electrode 29c is electrically connected to the island-shaped region 23 of the n-type buried layer as the collector region through the n+ type buried layer 31 and the n+ type electrode contact region 32.

It is noted that the base contact electrode 26 of the p+ type polycrystal silicon layer is deposited on a thin insulating film 34 formed on a semiconductor surface, and the base contact electrode 26 is contacted with the epitaxially grown layer or the island-shaped region 23 through an opening 35 formed in the insulating layer 34 to effect the above described diffusion of the n-type impurities. In this case, the opening 35 is formed at a position spaced a predetermined distance from the boundary of the isolation region 22 to avoid the effect of the so-called bird's beak otherwise produced on the boundary of the isoration region 22 upon selective oxidation of silicon to form the isolation region to suppress the fluctuations in the dimensional accuracy. Therefore, the graft base region 24g is provided at a predtermined distance from the isolation region 22.

According to the present invention, there is provided an region 37 which is to be the depletion region at least during the operation of the element in the vicinity of a portion on the surface of the semiconductor substrate or the surface of the island-shaped region 23 of the aforementioned epitaxial layer lying between the isolation region 22 and the graft base region 24g as the base contact region having higher concentration, more specifically, this region 37 is designed for example as the so-called intrinsic semiconductor region.

Such intrinsic semiconductor region 37 may be formed by previously introducing p-type impurities by, for example, ion implantation, in an amount which will cancel the n-type impurities of the aforementioned n-type epitaxial layer. Alternatively, the semiconductor region 37 may be formed to provide the n− or p− type having low impurity concentration so that a state of sufficient depletion may be satisfied in the operating state.

Figure 2:
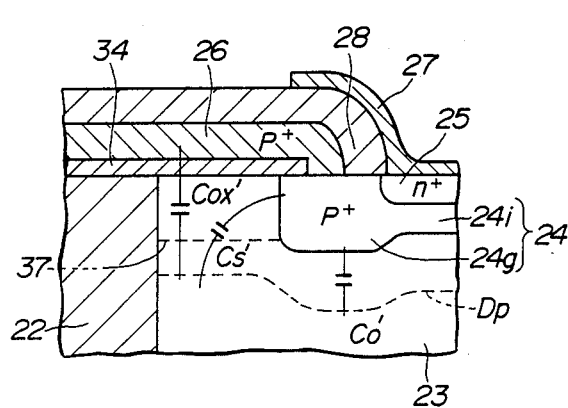
FIG. 2 is a schematic sectional view showing essential parts of the embodiment of FIG. 1 to an enlarged scale.

FIG. 2 shows to an enlarged scale a portion extending between the graft base region 24g and the isolation region 22 in the operating state, wherein the depletion region $D_p$ is formed continuously between the graft base region 24g and the isolation region 22 as the region 37 being depleted completely. At this time, the parasitic capacity $C_{ox'}$ under the thin insulating film 34 is markedly lowered since it is a series connection capacitance of the parasitic capacity $C_{ox}$ of the insulating film 14 of the prior art described above and the capacity of the depletion layer $D_p$. On the other hand, the capacity $C_{s'}$ at the lateral side portion of the graft base region 24g has its effective depletion layer increased in width so that the capacity $C_{s'}$ is reduced. It will be noted that, although the parasitic capacity $C_{o'}$ on the junction bottom surface is approximately same as that of the prior art, it has become possible to reduce the collector-base capacity markedly with the aforementioned capacities $C_{ox'}$ and $C_{s'}$ both being reduced.

Figure 3:
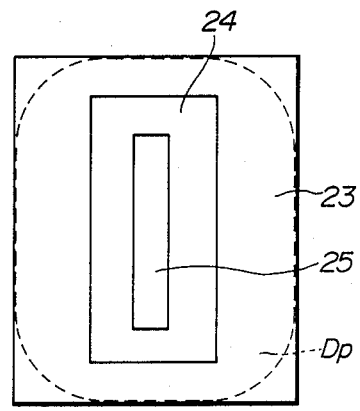
FIG. 3 is a schematic plan view showing an example of the depletion layer forming state according to the prior art.

When the region 37 is not provided, even though the depletion layer is widened by the bias voltage being applied between the collector and the base, there remains a portion difficult to be depleted such as at the corners of the island-shaped region 23 that is to be the collector area, as in shown in FIG. 3, so that the parasitic capacity due to it cannot be disregarded.

On the contrary, by previously providing the aforementioned intrinsic semiconductor region (which may be n− type p− type region) for promoting the depletion under the operating condition, a depletion layer is formed at the portion on the substrate surface between the graft base region 24 and the isolation region 22 in the vicinity of the island-shaped region 23 throughout the entire area.

Figure 4:
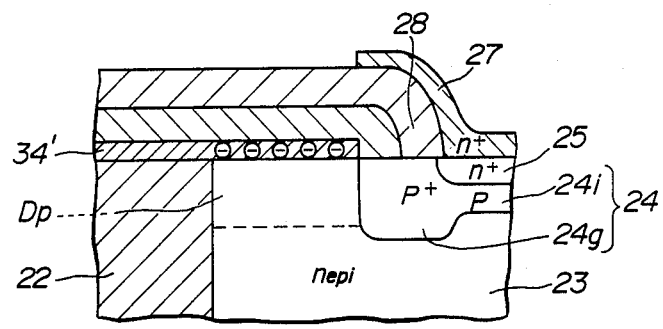
FIG. 4 is a schematic sectional view showing a modified embodiment of the present invention.
Figure 5:
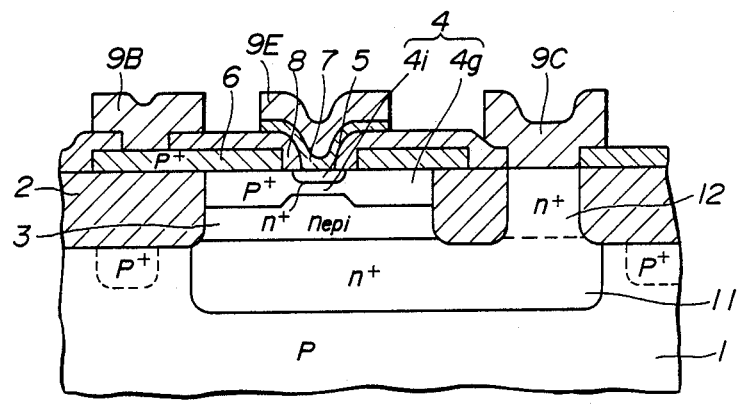
Figure 6:
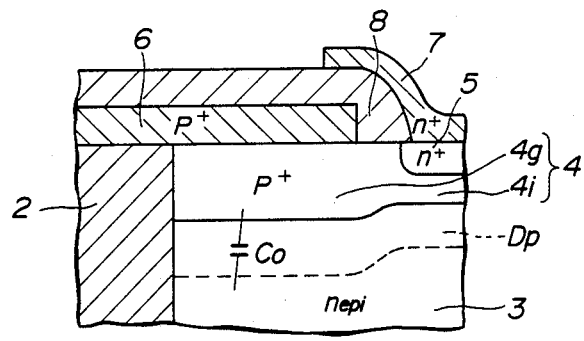
Figure 7:
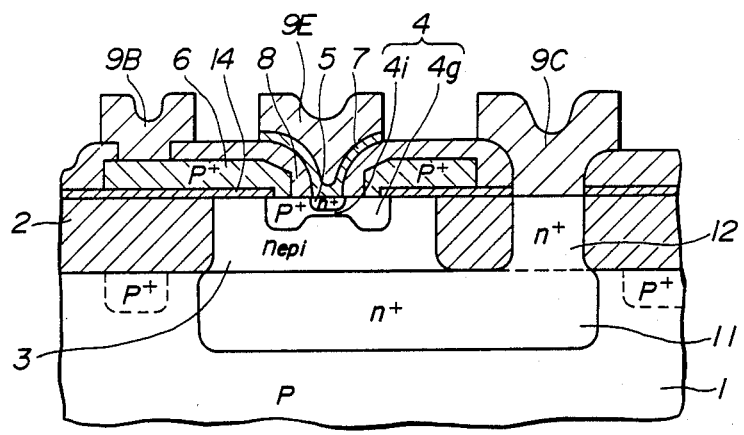
Figure 8:
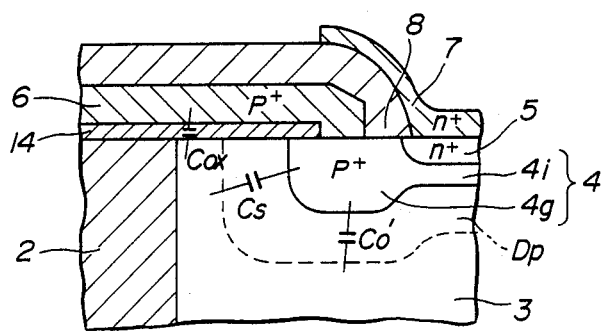

It will be noted that, for forming the depletion region in the vicinity of the substrate surface extending between the graft base region 24g and the isolation region 22 during the operation, an insulating layer of $Al_2O_3$ (alumina), for example, having the negative charges $Q_{ss}$ may be used as shown in FIG. 4 instead of providing the aforementioned intrinsic (or n− or p− type semiconductor region 37.

In the present embodiment of FIG. 4, the negative charges $Q_{ss}$ are formed in the insulating film 34', so that a depletion layer is apt to be formed in the vicinity of the surface of the island-shaped region 23 below the insulating film 34', so that the entire area between the graft base region 24g and the isolation region 22 in the vicinity of the substrate surface is depleted at least during the operation. The parasitic capacity can naturally be reduced by such depletion of the layer.

It is to be noted that the present invention is not limited to the above embodiment, but the p and n conduction types can be reversed. Various other changes may be made without departing from the purport of the invention.

It will be seen from above that, in the bipolar transistor of the present invention, the vicinity of the substrate surface between the base contact region (graft base region) and the isolation region (such as the island-shaped region of the epitaxially grown layer) becomes depleted at least during the operation, such that the parasitic capacity between the collector and the base is markedly reduced to provide for a high speed operation.

I claim as my invention:
1. A bipolar transistor comprising;

a semiconductor body of second conductivity type with a semiconductor layer of first conductivity type thereon, said semiconductor layer having a major surface, isolation regions formed adjacent to said major surface and extending through said semiconductor layer to said semiconductor body to laterally surround and define a first semiconductor region of said semiconductor layer of island-shape having first conductivity type adjacent to said major surface, a second semiconductor region having second conductivity type provided adjacent to said major surface and remote from said isolation regions, said second semiconductor region being formed of a first portion having a predetermined impurity concentration and a second portion along said major surface adjacent to and surrounding said first portion and having higher impurity concentration that said predetermined impurity concentration, a third region having the first conductivity type formed in said first portion adjacent to said major surface, wherein the entire surface portion of said first region between said isolation regions and said second portion of said second region is depleted of charge carriers during operation, thereby reducing the capacitance between said second region and said first region.

2. A bipolar transistor according to claim 1, wherein said surface portion is covered by an insulating layer having negative charges therein.

3. A bipolar transistor according to claim 1, further including an insulating layer overlying a portion of said major surface of said first region between said second region and said isolation region, a conductive layer overlying said insulating layer, said conductive layer making contact to said second portion of said second region and extending on said insulating layer at least to a position overlying said isolation region, whereby the capacitance between said conductive layer and said first region is reduced.

4. A bipolar transistor according to claim 1, wherein said isolation regions are made of insulating material.

* * * * *